United States Patent [19]
Pasch et al.

[11] Patent Number: 5,736,418
[45] Date of Patent: Apr. 7, 1998

[54] METHOD FOR FABRICATING A FIELD EFFECT TRANSISTOR USING MICROTRENCHES TO CONTROL HOT ELECTRON EFFECTS

[75] Inventors: Nicholas F. Pasch, Pacifica; Ana Ley, Sunnyvale, both of Calif.

[73] Assignee: LSI Logic Corporation, Milpitas, Calif.

[21] Appl. No.: 659,860

[22] Filed: Jun. 7, 1996

[51] Int. Cl.$^6$ ........................................... H01L 21/86
[52] U.S. Cl. ........................... 437/41; 437/44; 437/203
[58] Field of Search ................. 437/41 R, 41 RLD, 437/41 GS, 40 R, 40 GS, 44, 203, 228 PE, 913

[56] References Cited

U.S. PATENT DOCUMENTS

| | | | |
|---|---|---|---|
| 4,499,652 | 2/1985 | Shrivastava | 437/45 |
| 4,521,698 | 6/1985 | Taylor | 326/87 |
| 4,642,492 | 2/1987 | Beck et al. | 326/87 |
| 4,691,433 | 9/1987 | Pimbley et al. | 437/44 |
| 4,859,620 | 8/1989 | Wei et al. | 437/44 |
| 4,914,050 | 4/1990 | Shibata | 437/203 |
| 4,951,100 | 8/1990 | Parrillo | 257/344 |
| 5,007,982 | 4/1991 | Tsou | 156/643.1 |
| 5,017,265 | 5/1991 | Park et al. | 437/228 PE |
| 5,082,796 | 1/1992 | El-Diwany et al. | 437/44 |
| 5,098,866 | 3/1992 | Clark et al. | 437/239 |
| 5,142,640 | 8/1992 | Iwamatsu | 257/332 |
| 5,177,571 | 1/1993 | Satoh et al. | 257/336 |
| 5,182,234 | 1/1993 | Meyer | 437/228 |
| 5,231,042 | 7/1993 | Ilderem et al. | 437/44 |
| 5,352,914 | 10/1994 | Farb | 257/336 |
| 5,382,533 | 1/1995 | Ahmad et al. | 437/24 |
| 5,430,324 | 7/1995 | Bencuya | 257/495 |
| 5,488,003 | 1/1996 | Chambers et al. | 437/203 |
| 5,491,099 | 2/1996 | Hsu | 437/44 |

FOREIGN PATENT DOCUMENTS

| | | | |
|---|---|---|---|
| 60-57675 | 4/1985 | Japan | 437/40 RG |
| 0167966 | 3/1989 | Japan | 437/44 |
| 6163572 | 6/1994 | Japan | 437/44 |

*Primary Examiner*—Michael Trinh
*Attorney, Agent, or Firm*—Bardehle, Pagenberg, Dost, Altenburg, Frohwitter, Geissler

[57] ABSTRACT

According to the present invention, there is provided a method for fabricating a field effect transistor having reduced hot electron effects. In one embodiment, the method comprises the steps of disposing a gate oxide layer on a semiconductor substrate; disposing a gate material on the gate oxide layer; masking a portion of the gate material; anisotropically etching a gate structure into the gate material such that a trench is formed in the semiconductor substrate; implanting a source structure in the semiconductor substrate, the source structure having a first doping region superjacent a second doping region, the second doping region being lightly doped relative to the first doping region.

10 Claims, 4 Drawing Sheets

METHOD FOR FABRICATING A FIELD EFFECT TRANSISTOR USING MICROTRENCHES TO CONTROL HOT ELECTRON EFFECTS

BACKGROUND OF THE INVENTION

The present invention relates to field effect transistor devices and methods for manufacturing thereof and, more particularly, to such devices containing microtrench structures which decrease the deleterious effects of hot electrons.

Advances in integrated circuit technology have made possible the fabrication of transistors with channel lengths of less than one-half micrometer. Decreased cost and increased performance provide an impetus for miniaturizing semiconductor devices even further. However, as these devices are scaled down in size, electric field strength levels within the device increase as geometric distances shrink. These field strength levels are particularly high near the drain regions of field effect transistors ("FET"), millions of which may be formed on a single semiconductor device. Electrons flowing through the conduction channel between the source to drain regions of an FET gain energy from these electric fields and become energetic or "hot" electrons.

Hot electrons flowing in the conduction channel may produce unwanted effects. For example, hot electrons have a tendency to acquire sufficient energy to surmount the barrier between the semiconductor and the gate oxide and, as a result, are injected into the gate oxide. Subsequent trapping of the injected electrons tends to cause device instabilities such as threshold voltage shift, and transconductance degradation. These instabilities impose undesirably severe limitations on the further miniaturization of FET devices in VLSI circuits. Moreover, increasingly stringent reliability ratings are being imposed on the industry. For example, it is not unusual that a semiconductor device be rated to last ten years before becoming inoperative. With the improvements made to metalization chemistry over the last decade, hot electron effects have now become the most significant factor in limiting the operational life of a semiconductor device.

While improvement in hot electron effect problems can be partially effected by increasing the thickness of the gate oxide, this is an undesirable option because it reduces gate control and results in slower operating speeds. Other efforts at improving channel hot electron reliability have focused on reducing the lateral electrical field strength within the FET channel region. Such attempts include graded source-drain junctions, double-diffused source-drain regions and oxide sidewall spacers adjacent to the gate electrode and oxide. These methods reduce the lateral field strength, making the N+-P drain-channel transition less abrupt. Other attempts related to controlling hot electron effects are described in U.S. Pat. Nos. 4,499,652, 5,491,099, 4,859,620, 5,488,003, 5,098,866, 4,951,100, 5,142,640, 5,430,324, 5,177,571, 4,642,492, 4,521,698, 4,691,433, 5,382,533 and 5,352,914, all of which are incorporated herein by reference.

However, in spite of these efforts, the channel current flowing from the source to the drain is still located at the surface of the channel substrate, just below the gate oxide boundary. Therefore, even moderately energetic electrons may find their way into the gate oxide.

Accordingly, it is an object of the present invention to overcome the above-mentioned problems. Still further objects and advantages of the present invention will become apparent in view of the following disclosure.

SUMMARY OF THE INVENTION

According to the present invention, there is provided a method for fabricating a field effect transistor having reduced hot electron effects. In one embodiment, the method comprises the steps of disposing a gate oxide layer on a semiconductor substrate, e.g., a wafer; disposing a gate material, such as polysilicon, on the gate oxide layer; masking a portion of the gate material; anisotropically etching a gate structure into the gate material such that a trench is formed in the semiconductor substrate; implanting a drain region in the semiconductor substrate, the drain region having a first doping region superjacent a second doping region, the second doping region being lightly doped relative to the first doping region.

Also according to the present invention, there is provided a field effect transistor formed on a semiconductor substrate having reduced susceptibility to hot electron effects. In one embodiment, the transistor comprises a gate separated from the semiconductor substrate by a gate oxide; a source implanted into the semiconductor substrate; a drain implanted into the semiconductor substrate, the drain having a first doping region superjacent to a second doping region, the second doping region being lightly doped relative to the first doping region; and a trench formed between the gate and drain, the trench extending into the semiconductor substrate from about 50 to about 500 angstroms.

DETAILED DESCRIPTION OF EMBODIMENTS OF THE INVENTION

Figure 1:
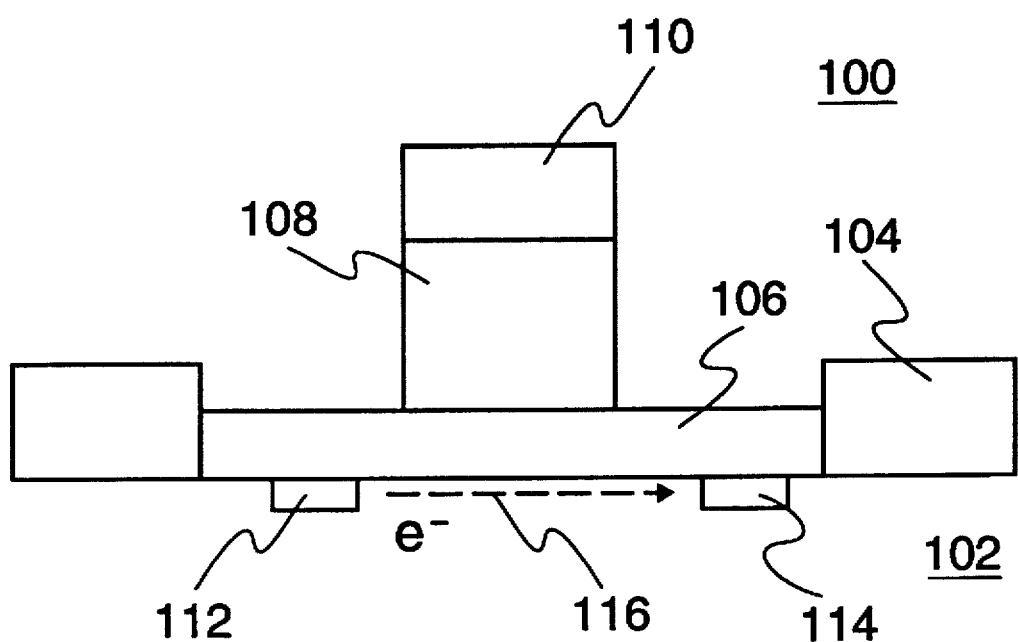
FIG. 1 is a cross-sectional view of a transistor according to the prior art.

Referring now to FIG. 1, there is shown a cross-section of field effect transistor 100 formed according to conventional techniques. A variety of known methods may be used to form the structure shown in FIG. 1. For instance, in one method, a silicon nitride layer is formed on top of a silicon substrate or wafer. The silicon nitride is then patterned with photoresist, and the silicon nitride areas unprotected by the photoresist are etched away with an etchant, such as phosphoric acid. Next, the photoresist is stripped, leaving patches of silicon nitride on top of the substrate surface. These patches of silicon nitride cover portions of the substrate where transistors will eventually be formed. After the photoresist is stripped, the substrate is placed into a furnace, and a field oxide layer is grown on top of the areas of exposed silicon. The silicon nitride is then removed from the substrate, which is then cleaned in an HF dip. The substrate is then placed into a gate oxide furnace, and a high quality gate oxide of approximately 100 angstroms thick is grown on the exposed silicon. After the gate oxide is grown, the substrate is placed in a deposition furnace and approximately 3,500 angstroms of polysilicon is deposited on top of the wafer. The polysilicon is then patterned with photoresist and anisotropically etched to form the transistor 100 as shown in the figure.

As shown in the figure, the transistor 100, the field oxide ("FOX") 104 and the gate oxide 106 are disposed on the semiconductor substrate 102. After the anisotropic etching, only the polysilicon structure 108, which has been protected by the resist 110, remains. The polysilicon structure 108 forms the gate of the transistor 100. Source 112 and drain 114 regions are later implanted into the substrate 102 on opposite sides of the gate through conventional methods.

A transistor manufactured according to FIG. 1 will be susceptible to the negative effects of hot electrons because the conduction channel 116 between the source 112 and the drain 114 will be close to the surface of substrate 102. Moreover, the transistor 100 provides no mechanism to reduce the energy levels of any hot electrons which are generated.

Figure 2:
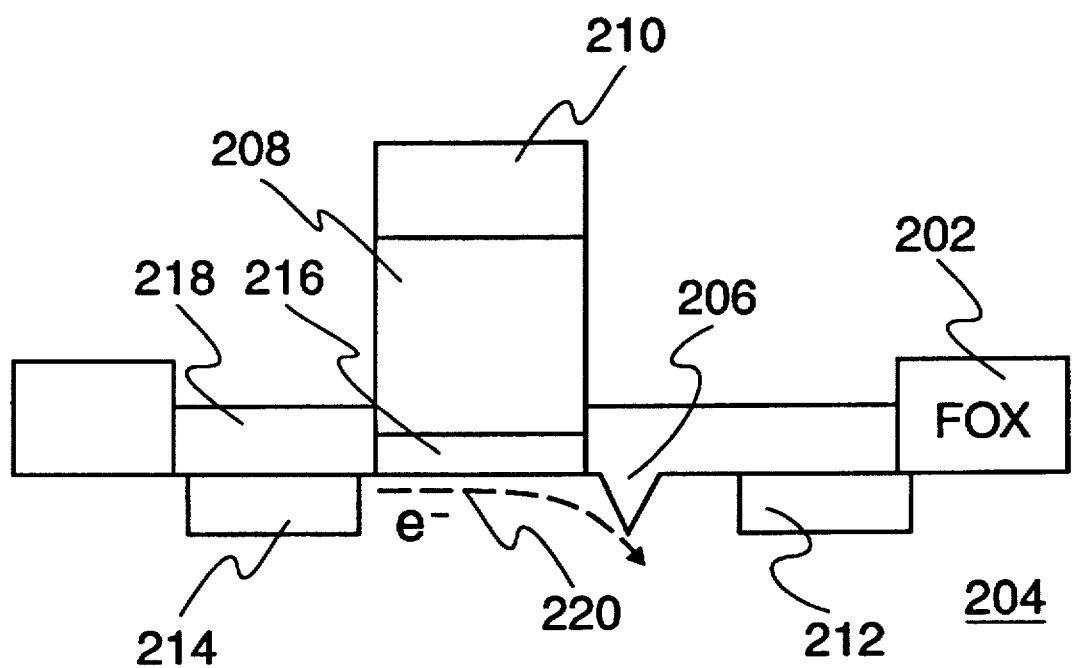
FIG. 2 is a cross-sectional view of a field effect transistor according to an embodiment of the invention.

Referring now to FIG. 2, there is shown a transistor according to one embodiment of the invention which addresses the deficiencies of the transistor shown in FIG. 1. The transistor is formed on substrate 204 in an area where the field oxide 202 has been etched away. The transistor comprises a polysilicon gate 208 separated from the surface of the substrate 204 by gate oxide 216. On one side of the gate 208 there is a source region 214 and on the other side there is a drain region 212. These regions are formed according to conventional techniques, such as ion implantation. Between the gate 208 and the drain 212 there is formed a trench 206. The trench 206 protrudes downward into substrate 204 and into the conduction channel 220 between the source 214 and drain 212. Oxide layer 218 results from further processing steps which are known to those with skill in the art and will not be described further.

In one embodiment, the trench 206 is formed as a result of the anisotropic etch of the polysilicon gate structure, i.e., gate 208 and gate oxide layer 216. In other words, the anisotropic etching of the polysilicon is tuned to provide sufficient overetch to not only break through the polysilicon but the gate oxide as well. The trench 206 quickly forms because the gate 208 serves to concentrate reactive atoms at its base. This causes a much higher etch rate at the base of the gate 208 than elsewhere on the substrate 204. Also, it should be pointed out that similar trenches may also be formed between the source 214 and the gate 208. Tuning the anisotropic etching process to achieve the desired amount of overetching is largely a matter of reducing the differential etch rate, i.e., the ratio of the polysilicon etch rate to the gate oxide etch rate. By increasing the oxide etch rate relative to the polysilicon etch rate, it is possible to create the trenches and control their size. Several suitable methods for tuning the anisotropic etch are provided according to the following embodiments of the invention. However, because of the wide variety of equipment available, it is to be understood that further acceptable methods will occur to those skilled in the art which are suited to their specific equipment.

One method known to be suitable for etching the gate structure and creating the trenches 206 is gas plasma etching. An apparatus useful to perform the gas plasma etching is the model 9400 TCP (Transformer Coupled Plasma) manufactured by Lam Research Corporation. Of course, other suitable machines will occur to those with skill in the art.

In one embodiment of the invention, the substrate bias on the gas plasma apparatus is increased in order to cause the number of charged particles striking the surface of the device being fabricated to increase relative to the number of uncharged particles. The increase in the number of charged particles will not significantly affect the etch rate of the polysilicon because the etch rate of the polysilicon is limited by the rate of removal of gaseous byproducts of the etching. However, the gate oxide is not as reactive with the neutral particles coming from the plasma, and therefore, the rate of etching of the gate oxide is proportional to the rate of high energy bombardment of charged atoms.

In another embodiment, the differential etch rate is reduced by altering the gas plasma pressure in the etching apparatus. A low gas pressure favors highly energetic atoms, while a higher gas pressure favors uncharged, reactive atoms. Therefore, lowering the gas pressure also reduces the differential etch ratio. In one specific embodiment, the gas pressure is set between about 20 millitorr to about 5 torr.

Another way of altering the differential etch ratio is to change the plasma gas chemistry. In one version of the invention, the etching gas comprises chlorine, fluorine, bromine or combinations thereof. In order to increase the number of charged atoms striking the device being etched, the chemistry is altered to increase the number of, for example, chlorine atoms. In one specific embodiment, for example, the etching gas comprises between about 1 part and about 10 parts chlorine, about 0 to about 1 part bromine, and about 1 to about 100 parts helium. The helium functions as a carrier gas for the chlorine and bromine atoms.

According to another embodiment of the invention, the differential etch rate is reduced by controlling the overall power supplied to the plasma etching apparatus. For example, in one specific embodiment the power is set between about 200 watts and about 400 watts.

Although the actual process parameters required for creating the trenches will vary widely depending on such factors as the technology being used, the number of steps required to produce an individual wafer and the etching equipment used, one set of suitable parameters useful with the TCP 9400 system, manufactured by Lam Research, is as follows:

| Pressure (Mtorr) | 15 to 35 |
| RF Top (Watts) | 250 to 450 |
| RF Bottom (Watts) | 10 to 50 |
| Cl2 (sccm) | 5 to 30 |
| HBr (sccm) | 30 to 90 |
| He Clamp (torr) | 7 to 12 |

These parameters, used during the main etch step will produce suitable trenches according to an embodiment of the invention.

Figure 3:
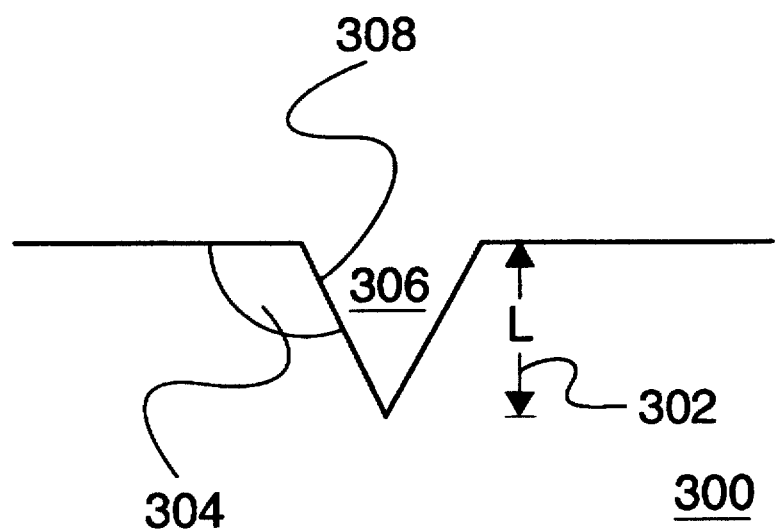
FIG. 3 is a cross-sectional view of a field effect transistor according to a further embodiment of the invention illustrating certain dimensional details.

When the etching process is properly set up, the trenches will be formed as shown in FIG. 3. As shown, trenches 306 formed by the plasma etching advantageously have a "V" or chevron-shaped cross-section and extend into the semiconductor substrate 300 a distance "L" 302. In one embodiment, the trench extends into the substrate about 50 to about 500 angstroms. The side walls 308 of the trench slope into the substrate at an angle 304 of between about 45° to about 70° from the semiconductor surface, although even shallower angles could be used in other embodiments of the invention.

Referring again to FIG. 2, the transistor 200 provides improved control of hot electron effects because the trench 206 causes electrons 220 traveling from the source 214 to the drain 212 in the conduction channel of the transistor 200 to be forced downward, i.e., away from the surface of substrate 204. This forced change in the current path of the electrons functions as an electrical resistance which slows down the velocity of the electrons. Moreover, by forcing the electrons deeper into the substrate 204, the resistance encountered by the current naturally increases because the doping concentration of the substrate 204 decreases away from the surface of the substrate 204. This effect is exploited in the embodiment shown in FIG. 4.

Figure 4:
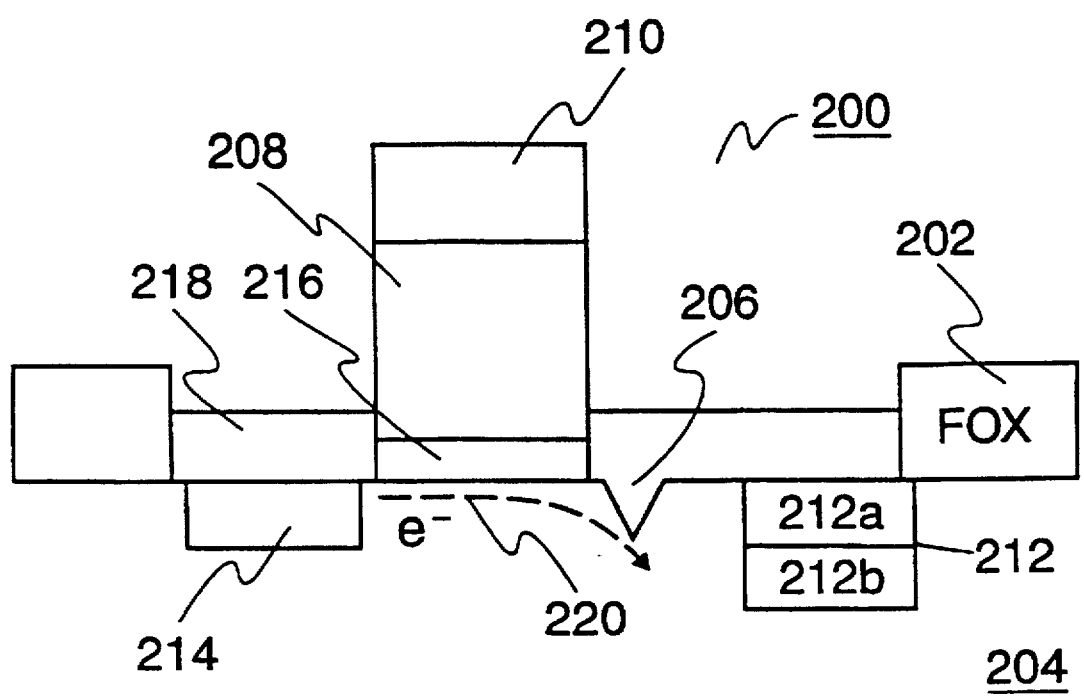
FIG. 4 is a cross-sectional view of a transistor according to still a further embodiment of the invention.

FIG. 4 shows a transistor in which the drain 212 comprises two doped regions, 212a and 212b. Doping region 212b is lightly doped relative to doping region 212a. This type of drain structure further reduces the undesirable effects of hot electrons. Specifically, since doping region 212b is not as heavily doped as region 212a, the electric field in the vicinity of region 212b is less than that of 212a. The current 220 traveling from source 214 to drain 212 is forced downwards into substrate 204 by the trench 206. Therefore, the current encounters the lower electric field of region 212b. Therefore, the electric field experienced by the electrons in the current is substantially reduced as they enter the drain 212, and they are not provided with sufficient energy to be injected into the gate oxide. Fabrication of the doping regions 212a and 212b is performed according to conventional methods, such as ion implantation, and will not be further described here.

The above embodiments are intended merely to illustrate the present invention and are not to be considered limiting of its scope because the invention may admit to other equally effective embodiments. For example, various plasma compositions and apparatus settings will occur to those with skill in the art without departing from the scope and spirit of the present invention.

What is claimed is:

1. A method for fabricating a field effect transistor having reduced hot electron effects, the method comprising:

disposing a gate oxide layer on a semiconductor substrate;

disposing a gate material on the gate oxide layer;

masking a portion of the gate material;

anisotropically etching the gate material into a gate structure such that a trench having a V-shape and a depth extending between about 50Å and less than 500Å is formed in a first portion of the semiconductor substrate adjacent to the gate structure; and implanting ion impurities into the semiconductor substrate to form a drain structure in a second portion of the semiconductor device, wherein the drain structure is spaced apart from the gate structure by said trench, and wherein the drain structure has a first doping region superjacent a second doping region, the second doping region being lightly doped relative to the first region.

2. A method as in claim 1 wherein anisotropically etching the masked gate material comprises gas plasma etching at a plasma pressure of between about 20 mT to about 5 T.

3. A method as in claim 1 wherein anisotropically etching the masked gate material comprises plasma etching with an etching gas, the etching gas comprising a gas selected from the group consisting of Cl, F and Br.

4. A method as in claim 3 wherein anisotropically etching the masked gate material comprises plasma etching with an etching gas, the etching gas comprising a carrier gas selected from the group consisting of Ar, He, Ne, Kr or mixtures thereof.

5. A method as in claim 3 wherein the etching gas further comprises between about 1 to about 10 parts Cl.

6. A method as in claim 3 wherein the etching gas further comprises less than about 1 part Br.

7. A method as in claim 3 wherein the etching gas further comprises between about 1 and about 100 parts He.

8. A method as in claim 1 wherein anisotropically etching a gate structure comprises plasma etching wherein a power in a plasma reactor is between about 200 watts to about 400 watts.

9. A method as in claim 1 wherein walls of the formed trench having a V-shape and a depth extending between about 50Å and less than 500Å slope into the semiconductor substrate at an angle between about 45° and about 70°.

10. A method as in claim 1 wherein walls of the formed trench having a V-shape and a depth extending between about 50Å and less than 500Å slope into the semiconductor substrate at an angle of less than about 45°.

* * * * *